United States Patent
Bez et al.

(10) Patent No.: US 6,294,431 B1
(45) Date of Patent: Sep. 25, 2001

(54) PROCESS OF MANUFACTURE OF A NON-VOLATILE MEMORY WITH ELECTRIC CONTINUITY OF THE COMMON SOURCE LINES

(75) Inventors: Roberto Bez; Caterina Riva, both of Milan; Giorgio Servalli, Ciserano, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/547,520

(22) Filed: Apr. 12, 2000

(30) Foreign Application Priority Data

Apr. 14, 1999 (EP) .................................................. 99830211

(51) Int. Cl.[7] .................................................. H01L 21/8247
(52) U.S. Cl. .................... 438/264; 438/257; 438/268; 438/273; 438/279; 438/302; 438/324
(58) Field of Search .................................... 438/257, 264, 438/268, 273, 302, 324, 279

(56) References Cited

U.S. PATENT DOCUMENTS

| 5,807,778 | * | 9/1998 | Lee .................................. 438/257 |
| 5,894,146 | * | 4/1999 | Pio et al. ........................... 257/319 |
| 6,022,778 | * | 2/2000 | Contiero et al. ................. 438/268 |
| 6,097,057 | * | 8/2000 | Dalla Libera et al. ........... 257/316 |
| 6,180,460 | * | 1/2001 | Cremonesi et al. ............. 438/264 |

FOREIGN PATENT DOCUMENTS

| 05198778 | 8/1993 | (JP) . |
| 07111294 | 4/1995 | (JP) . |
| 10022483 | 1/1998 | (JP) . |

* cited by examiner

*Primary Examiner*—Matthew Smith
*Assistant Examiner*—V. Yevsikov
(74) *Attorney, Agent, or Firm*—Theodore E. Galanthay; E. Russell Tarleton; Seed IP Law Group PLLC

(57) ABSTRACT

A process for the manufacture of a non-volatile memory with memory cells arranged in word lines and columns in a matrix structure, with source lines extending parallel and intercalate to said lines, said source lines formed by active regions intercalated to field oxide zones, said process comprising steps for the definition of active areas of said columns of said matrix of non-volatile memory cells and the definition of said field oxide zones, subsequent steps for the definition of the lines of said matrix of non-volatile memory cells, and a following step for the definition of said source lines. In said step for the definition of the source lines, a process step comprises selectively introducing dopant to form a layer of buried silicon with high concentration of dopant, said layer of buried silicon being formed to such a depth to coincide with the regions of silicon of the underlying field oxide zones, and the introduction of dopant in said active regions of the source lines to superficially contact said layer of buried silicon.

22 Claims, 7 Drawing Sheets

PROCESS OF MANUFACTURE OF A NON-VOLATILE MEMORY WITH ELECTRIC CONTINUITY OF THE COMMON SOURCE LINES

TECHNICAL FIELD

The present invention relates to a process of manufacture of a non-volatile memory, particularly of an EPROM or Flash EPROM memory type in NOR type configuration, and, more particularly, to a process assuring the electric continuity of the common source lines present in the matrix of memory cells.

BACKGROUND OF THE INVENTION

In matrixes of self-aligned cells, present in EPROM or Flash EPROM non-volatile memories, a problem is presented by the definition of common source lines in the active area zones. With the use of sufficiently large memory cells, these lines are defined together with the definition of the active area and are subsequently doped. With the miniaturization of the cells, the source lines are instead defined in a step following the definition of the active area and the gate, through a dedicated mask. In fact, in a conventional process for the realization of a matrix of non-volatile memory cells, for instance EPROM type, after having defined the active area zones, covered by a thin layer of oxide (gate oxide), and the field oxide zones, a first layer of polycrystalline silicon or polysilicon is deposited on the whole surface of the silicon wafer and therefore, through an opportune mask, the first polysilicon layer is etched for forming regions of lower polysilicon along the active areas, where the bits line will be formed.

In a following step there is provided the deposition of an intermediate dielectric layer (for instance ONO) on the whole surface of the wafer and therefore the definition, through the deposition of a second polysilicon layer and a subsequent selective etching, of seconds strips of upper polysilicon, superimposed and transversal to the aforesaid regions of lower polysilicon, that constitute the words line. The several intersections between each word line and each bit line form the memory cells. In a following step, a second mask is used for allowing the execution of a source implant. According to a process largely used for the production of EPROM or Flash EPROM type memory cells, defined SAS (Self-Aligned Source), it is initially foreseen a coverage of the drain zones of the cell through a mask shaped as rectangular strips that are aligned to the middle of the gate strips. Subsequently the thick oxide present in the zones between the gate strips not covered by the mask is etched, for the removal of the thick oxide. A step of ionic implant of a dopant in the silicon wafer is subsequently effected for the formation of the regions of source and drain of the matrix of memory cells and to guarantee an electric continuity of the source lines.

At this point, a thermal treatment of reoxidation is performed.

Subsequently a dielectric layer is deposited, for instance TEOS, which uniformly covers the structure. Such dielectric layer is etched to define insulating sidewall spacers, adjacent to every gate region. A further step of implanting of dopant of the same type follows, both for the source lines and for the drain lines.

A different technique used for getting electrically continuous common source lines is the "STI" (Shallow Trench Isolation) technique. During the step of the previously-described process for the manufacture of a matrix of non-volatile memory, which foresees a second etching of the first polysilicon layer, the active area zones no more covered by the gate oxide or by the first polysilicon layer are also etched, and excavations are therefore formed in the uncovered silicon. The STI technique foresees, in a process step preceding the formation of such excavations, the introduction of a dopant in the zones wherein such excavations will be formed, creating highly-doped regions deeper than the excavations so as to decrease the resistance of the common source lines of the matrix of non-volatile self-aligned memory cells. Such excavations will be subsequently filled with oxide.

The SAS process is particularly onerous and inherently introduces several problems. In fact it is necessary to perform an etching for the removal of the field oxide that leaves the uncovered zones of silicon and polysilicon unaffected, nevertheless it is possible that the edge of the gate oxide of some cells is also deformed provoking problems of reliability of the cell.

The STI process foresees the realization of an electric continuity of the common source lines through the presence of doped zones, with the same type of dopant of the source regions that cover the excavations. Nevertheless, such zones can introduce some pinching, due to a non-uniform doping, that cause a discontinuity of the source lines creating zones of high resistance.

SUMMARY OF THE INVENTION

In view of the state of the art described, the disclosed embodiments of the present invention provide a process of manufacture that guarantees an electric continuity of the source lines of a matrix of non-volatile self-aligned memory cells.

According to the embodiments of the present invention, such object is reached through a process for the manufacture of a non-volatile memory with memory cells arranged in lines and columns in a matrix structure, with source lines extending parallel and intercalate to said lines, said source lines formed by active regions intercalated to field oxide zones, said process comprising steps for the definition of active areas of said columns of said matrix of non-volatile memory cells and the definition of said field oxide zones, subsequent steps for the definition of the lines of said matrix of non-volatile memory cells, a following step for the definition of said source lines. The process is further characterized by the fact that in the step for the definition of the source lines, a process step comprising a selective introduction of dopant is accomplished to form a high dopant concentration buried layer of silicon, said buried silicon layer being formed to such a depth to coincide with the regions of silicon underlying the field oxide zones, a subsequent introduction of dopant in said active regions of the source lines to superficially contact said buried silicon layer.

In accordance with the disclosed embodiments of the present invention, it is possible to realize through an implant of dopant of source in the regions underlying the zones of thick oxide a buried region having an electric continuity between the surface of the silicon with the source lines.

BRIEF DESCRIPTION OF THE DRAWINGS

The features and advantages of the disclosed embodiments of the present invention will be evident from the following detailed description of two embodiments thereof, illustrated as non-limiting examples in the annexed drawings, wherein.

DETAILED DESCRIPTION OF THE INVENTION

Figure 1:
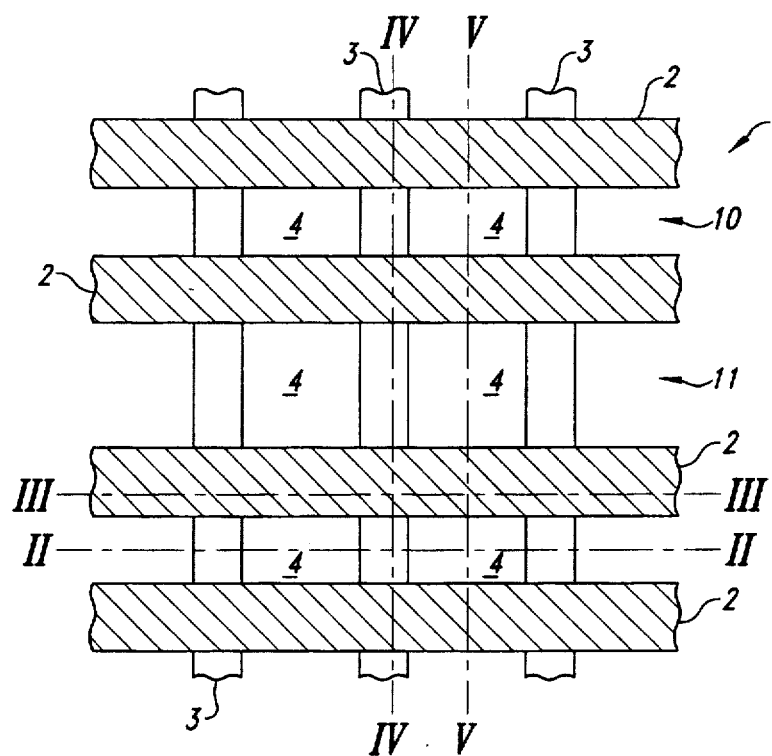
FIG. 1 shows in top plan view a portion of a conventional matrix of non-volatile memory of the EPROM type.
Figure 2:
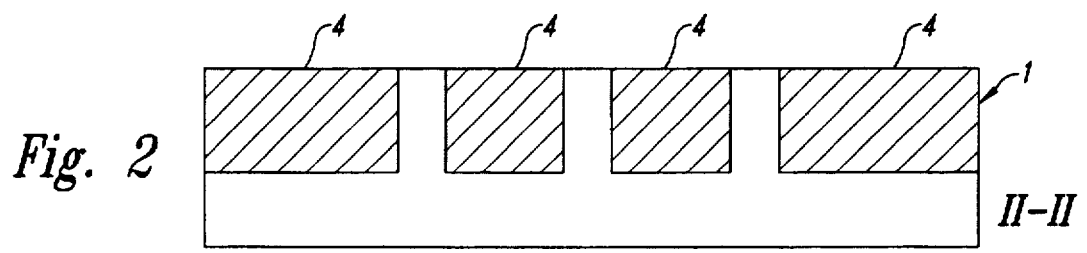
FIG. 2 shows the cross-section along line II—II of FIG. 1.
Figure 3:
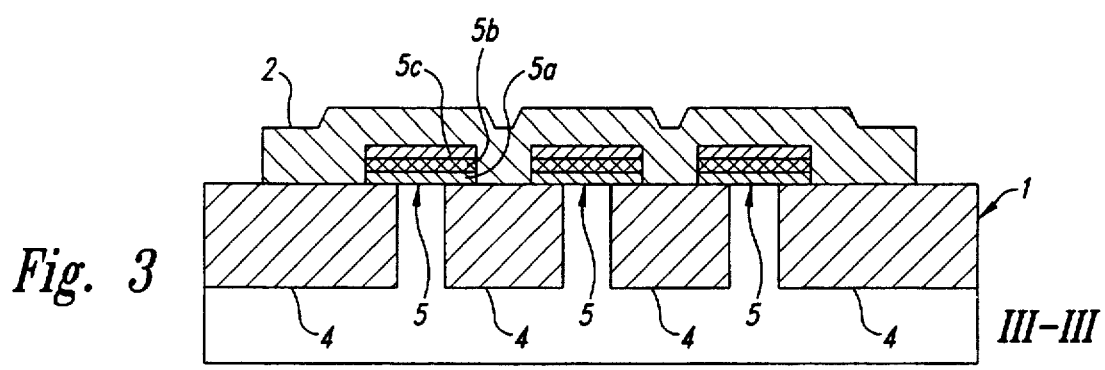
FIG. 3 shows the cross-section along line III—III of FIG. 1.
Figure 4:
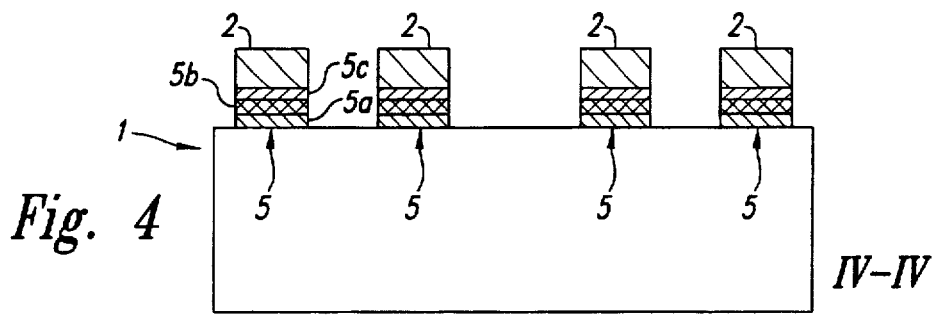
FIG. 4 shows the cross-section along line IV—IV of FIG. 1.
Figure 5:
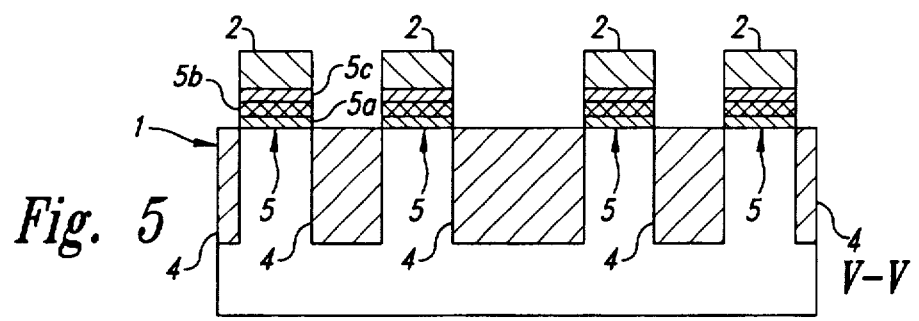
FIG. 5 shows the cross-section along line V—V of FIG. 1.

With reference to the annexed drawings, and particularly in FIG. 1, a semiconductor wafer 1 is shown in which a portion of a non-volatile memory matrix of EPROM type will be realized. The strips of active area 3, all parallel to each other, which correspond to bit lines of EPROM memory cells, are perpendicularly intersected by polysilicon strips 2, also parallel, that correspond to word lines of memory cells. In FIG. 1 zones 10 corresponding to source lines and regions 11 composed of zones of thick oxide 4 and zones where active drain regions will be realized are also shown. In FIGS. 2–5 there are shown cell cross-sections describing in more detail the gate zones of the device where stacks of layers 5 are present, composed by a thin oxide layer 5a, a polysilicon layer 5b, and a dielectric layer 5c, and regions internal to the wafer 1 in which field oxide 4 is present.

Figure 6:
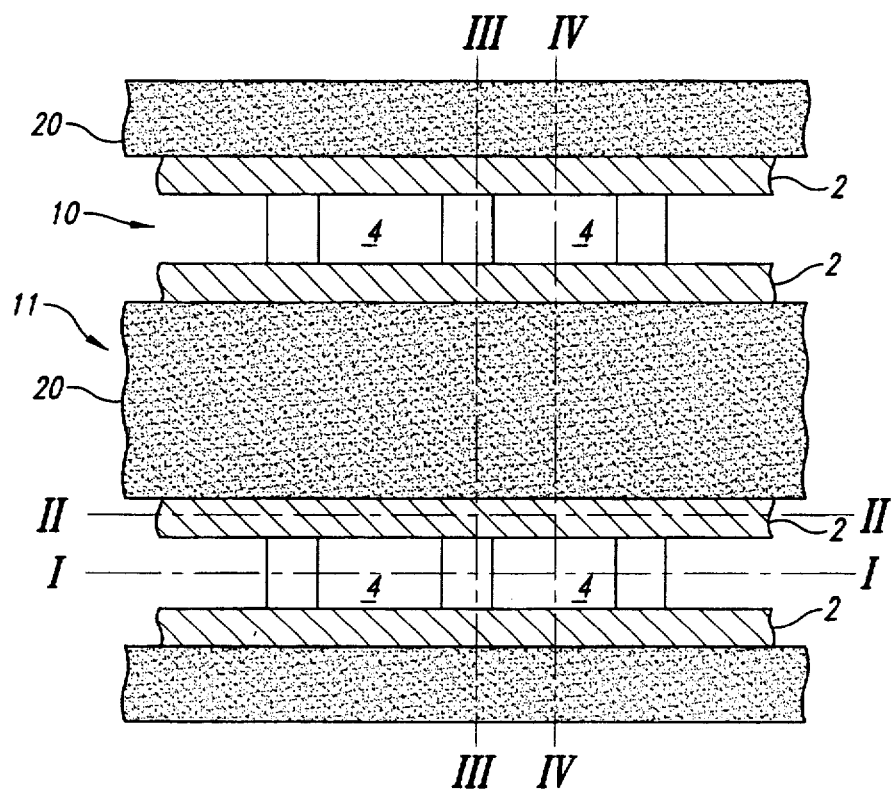
FIG. 6 is analogous to FIG. 1, from which it differs for the presence of a mask of resist according to a first step of the SAS technique.
Figure 7:
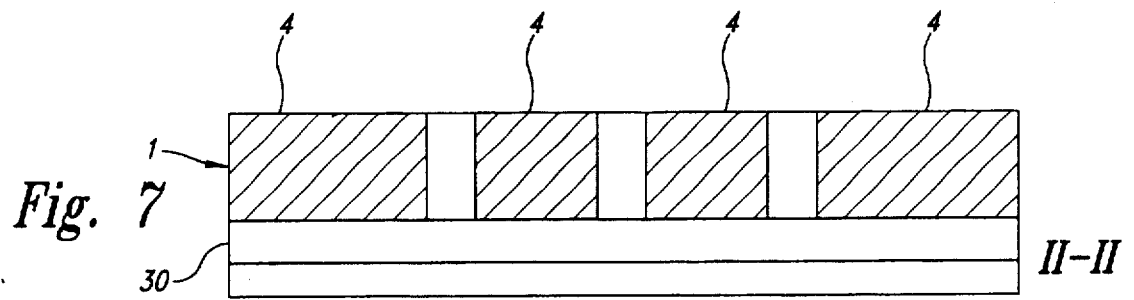
FIGS. 7–10 respectively show the cross-sections along lines II—II, III—III, IV—IV, V—V of FIG. 6 after a first process step according to an embodiment of the present invention.
Figure 8:
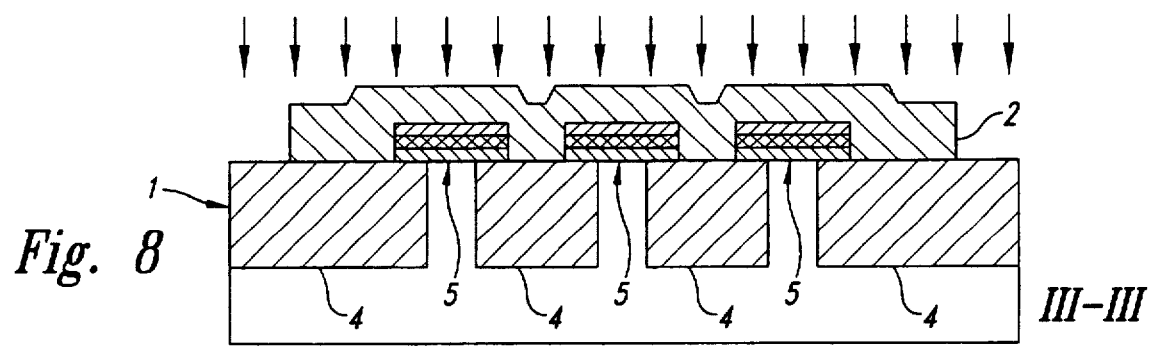
Figure 9:
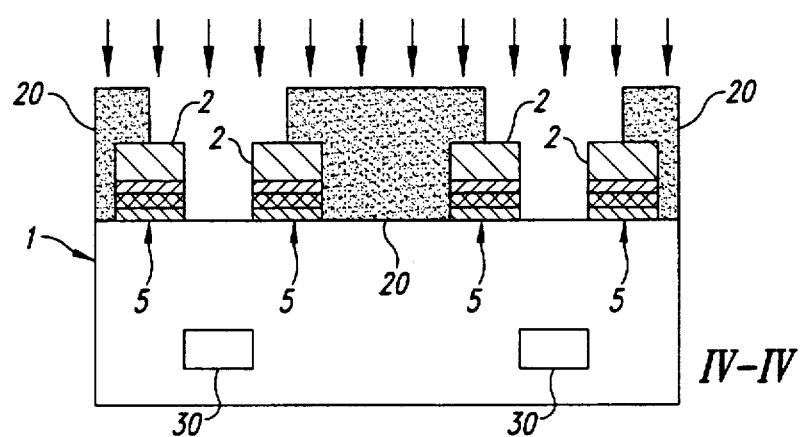
Figure 10:
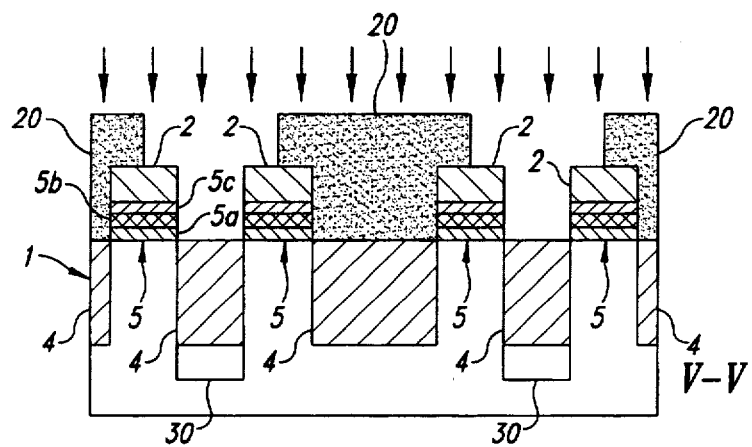
Figure 11:
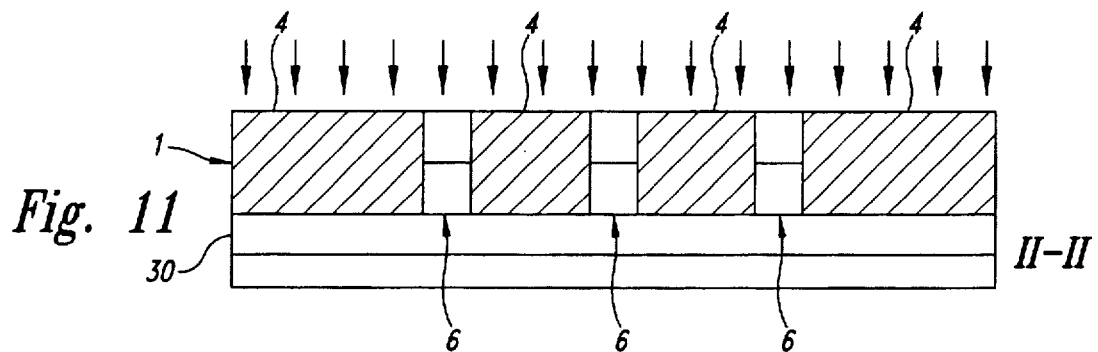
FIGS. 11–14 respectively show the cross-sections along lines II—II, III—III, IV—IV, V—V of FIG. 6 after a second process step according to a first embodiment of the present invention.
Figure 12:
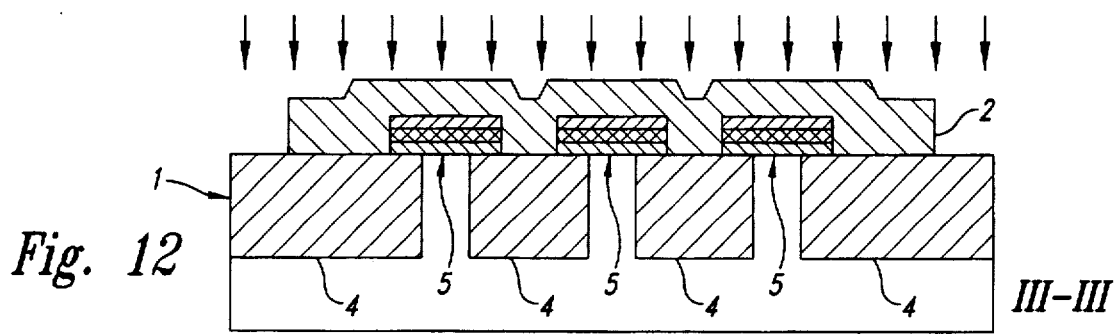
Figure 13:
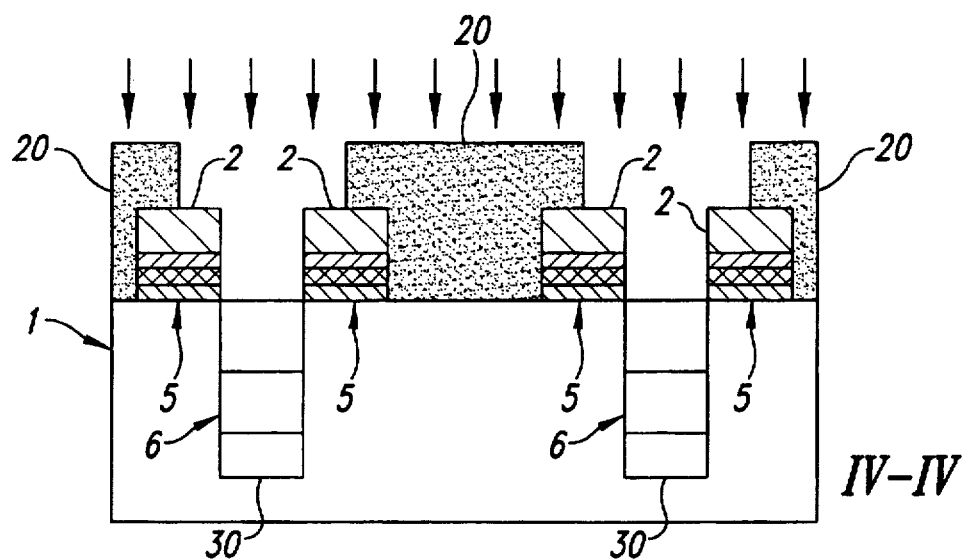
Figure 14:
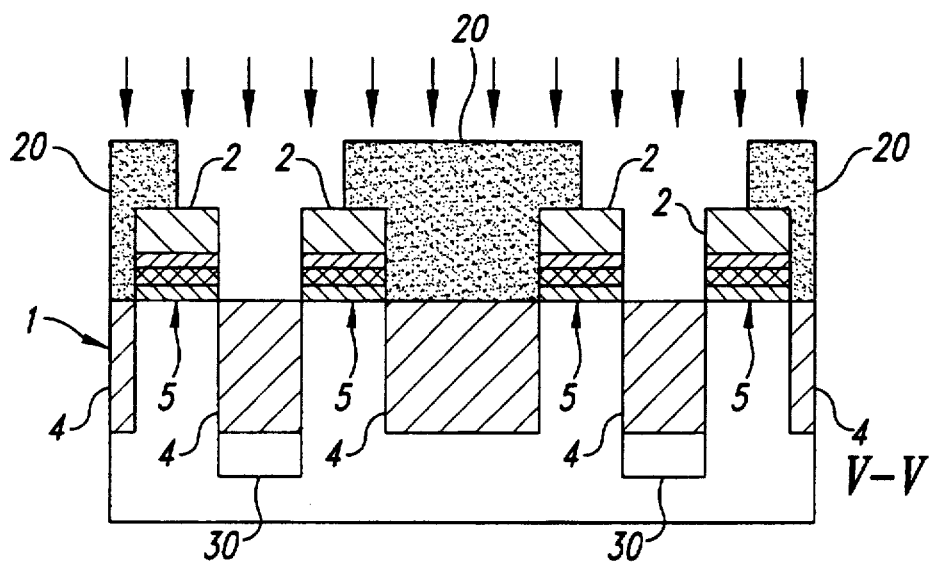

As shown in FIG. 6, according to a first process step typical of the SAS technique, the silicon wafer 1 is covered with a resist mask 20, shaped as rectangular strips covering the zones of the device corresponding to regions 11, and aligned to the middle of the polysilicon strips 2.

An embodiment of the present invention initially exploits the same photolithographic mask 20 used in the first step of the SAS process. Such mask 20 is used to perform an implant of N-type dopant ions into the silicon wafer 1. Such implant must be effected with an energy sufficiently high to allow passing through the field oxide zones 4 and the formation of a buried silicon layer 30 with a high concentration of N-type dopant, to such a depth to coincide with the regions of silicon underlying the field oxide zones 4, as shown in FIGS. 7–10.

A following process step provides for doping the surface of the silicon wafer 1 through further implants of dopant ions to medium and low energy, as shown in FIGS. 11–14. Such implants form inside the silicon wafer 1 zones of silicon 6 with concentration of N-type dopant, so to guarantee the electric continuity of the source lines 10 with the surface of the silicon wafer 1. Such zones of silicon 6 are located inside the strips of active area 3 between the strips of polysilicon 2, in the zones where the source lines will be realized.

Figure 15:
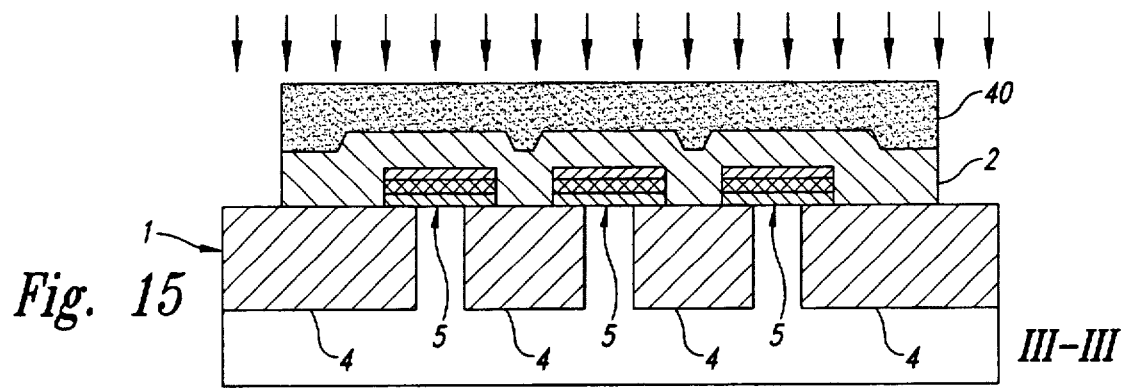
FIGS. 15–17 respectively show the cross-sections along lines II—II, III—III, IV—IV, V—V of FIG. 6 after a first process step according to a variation of the preceding embodiment of the present invention.
Figure 16:
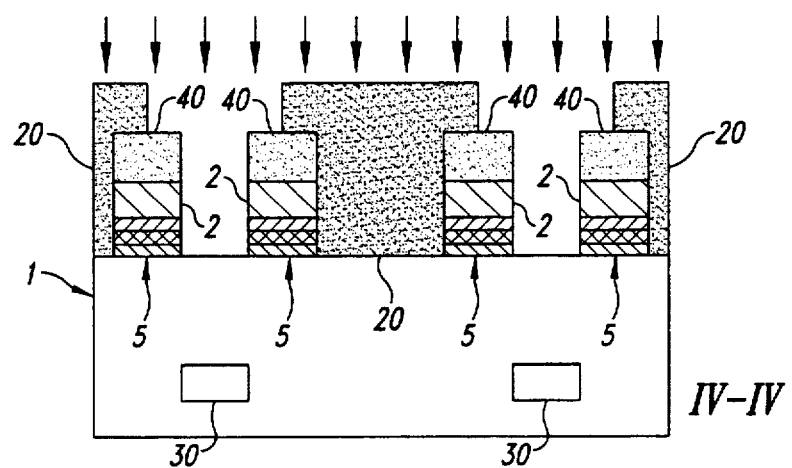
Figure 17:
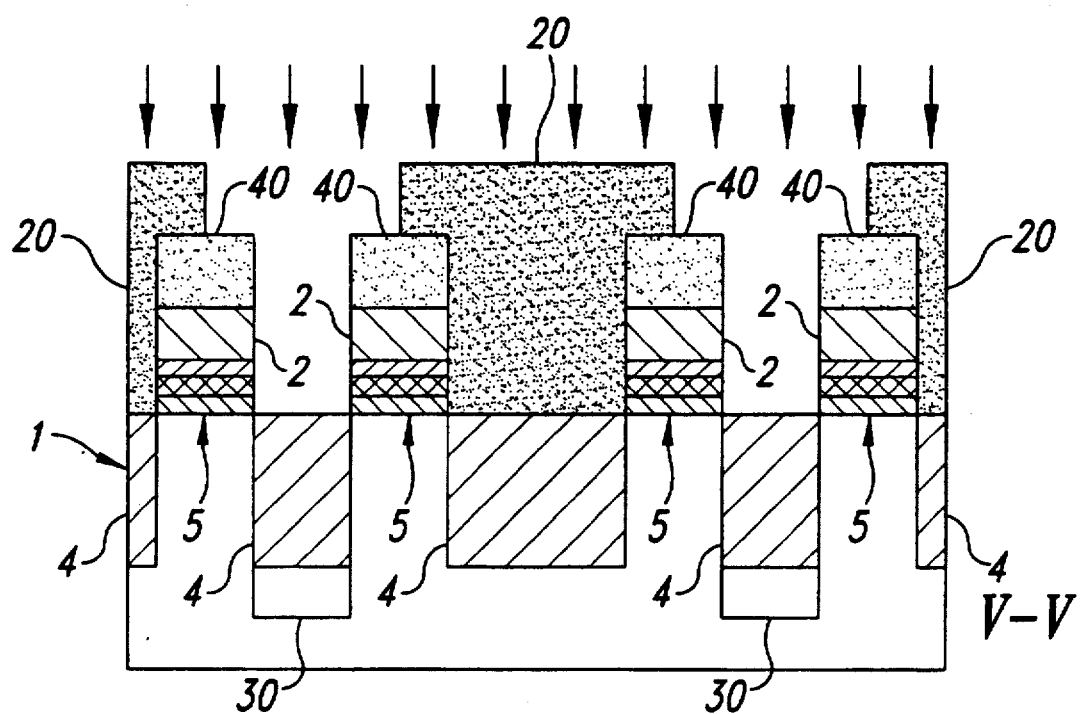

A variation of the preceding embodiment of the present invention, shown in FIGS. 15–17, provides for using a second resist mask 40 before the high-energy implant of N-type dopant ions. The mask 40 is formed by rectangular strips that cover the strips of polysilicon 2, and it is constituted by the same mask used for the definition of the gates of the cells. Such operation is made necessary if the thickness of the field oxide 4, that must be passed through by the N-type dopant ions, is not significantly lower than the sum of the thicknesses of the layers that form the cell, the gate oxide layer, the first polysilicon layer, the dielectric layer, and the second polysilicon layer. In fact, in such case, there would be the risk of doping part of the channel of the memory cell with N-type dopant, jeopardizing the efficiency of the memory cell.

While preferred embodiments of the invention have been illustrated and described, it is to be understood that changes may be made therein without departing from the spirit and scope of the invention. Thus, the invention is to be limited by the claims that follow and the equivalents thereof.

What is claimed is:

1. A process for the manufacture of a non-volatile memory with memory cells arranged in word lines and columns in a matrix structure, with source lines extending parallel and intercalate to said lines, said source lines formed by active regions intercalated to field oxide zones, the process comprising: defining active areas of the columns of the matrix of non-volatile memory cells and defining the field oxide zones; defining the word lines of said matrix of non-volatile memory cells; and defining said source lines by selectively introducing dopant to form a layer of buried silicon with a high concentration of dopant, said layer of buried silicon being formed to such a depth to coincide with the regions of silicon underlying the field oxide zones, a following introduction of dopant in said active regions of the source lines to superficially contact said layer of buried silicon.

2. The process of claim 1 wherein said selective introduction of dopant is effected through a photolithographic process through a mask constituted by resist, said mask formed by rectangular strips covering the field oxide zones of the device corresponding to said active regions, and substantially aligned with said word lines.

3. The process of claim 2 wherein said selective introduction of dopant for the realization of said layer of buried silicon provides for a high-energy implant of dopant ions to allow the crossing of the zones of thick oxide.

4. The process of claim 3 wherein said selective introduction of dopant to contact the layer of buried silicon provides for an implant of dopant ions at medium and low energy through a suitable photolithographic mask.

5. The process of claim 4 wherein said word lines are constituted by strips of polysilicon.

6. The process of claim 1 wherein said selective introduction of dopant is effected by a photolithographic process through a mask constituted by two superimposed masks, a first mask and a second mask, where said second mask is formed by rectangular strips constituted of resist covering the word lines, said second mask being the same mask used for the definition of the gates of the cell of said matrix of non-volatile memory cells, and said first mask being formed by rectangular strips constituted by resist covering the field oxide zones of the device corresponding to said active regions, and substantially aligned with said word lines.

7. The process of claim 1 wherein said implantations and introductions of dopant are implantations and introductions of N-type dopant.

8. A process for the manufacture of non-volatile memory having a matrix of memory cells that include a plurality of polysilicon strips, field oxide zones, and source lines on a silicon wafer, the process comprising:

forming a first resist mask on the silicon wafer, the first resist mask formed in alignment with the middle of the polysilicon strips;

implanting a first concentration of N-dopant ions into the wafer; and further implanting the wafer with a second concentration of N-dopant ions that is less than the first concentration of N-dopant ions to form zones of implanted silicon that provide electrical continuity between a surface of the silicon wafer and the source lines.

9. The process of claim 8 wherein implanting the first concentration of N-dopant ions comprises implanting the first concentration of N-dopant ions to a depth of the silicon wafer that underlies the field oxide zones.

10. The process of claim 9 wherein the zones of implanted silicon formed by the further implanting of the second concentration of N-dopants are formed inside strips of active areas located between the polysilicon strips.

11. The process of claim 8, further comprising forming an initial resist mask prior to forming the first resist mask, the initial resist mask being deposited completely over the polysilicon strips prior to the deposition of the first resist mask in alignment with the middle of the polysilicon strips.

12. The process of claim 11 wherein the initial resist mask is formed in the shape of rectangular strips.

13. The process of claim 12 wherein the implanting of the first concentration of N-dopant ions is performed to a depth that is below the field oxide zones in the silicon wafer.

14. The process of claim 13 wherein the zones of implanted silicon formed by the implanting of the second concentration of N-dopant ions are formed inside strips of active areas formed between the polysilicon strips.

15. A process for manufacturing non-volatile memory in a silicon wafer, comprising:

forming memory cells having word lines and columns arranged in a matrix structure, with source lines extending parallel to and between the word lines, the source lines formed by active regions between field oxide zones formed in the silicon wafer, the process comprising:

depositing a first resist mask that is aligned with the word lines;

implanting a first concentration of N-dopant ions into the wafer; and further implanting the wafer with a second concentration of N-dopant ions that is less concentrated than the first concentration of N-dopant ions to form zones of implanted silicon.

16. The process of claim 15 wherein the first resist mask is aligned with a middle portion of the word lines.

17. The process of claim 15 wherein the first concentration of N-dopant ions is implanted to a depth that is below the field oxide zones in the silicon wafer.

18. The process of claim 15 wherein the zones of implanted silicon are formed to provide electrical continuity between a surface of the silicon wafer and the source lines.

19. The process of claim 18 wherein the zones of implanted silicon are formed inside strips of the active areas between the word lines.

20. The process of claim 15, further comprising depositing an initial resist mask prior to depositing the first resist mask, the initial resist mask being deposited to completely cover the word lines.

21. The process of claim 20 wherein the zones of implanted silicon provide electrical continuity between a surface of the wafer and the source lines; and the zones of implanted silicon are formed inside strips of the active areas between the word lines.

22. The process of claim 15 wherein the word lines comprise polysilicon strips, and further wherein the zones of implanted silicon are formed inside strips of active areas between the polysilicon strips to provide electrical continuity between a surface of the silicon wafer and the source lines.

* * * * *